US011379753B1

(12) United States Patent
Leao et al.

(10) Patent No.: US 11,379,753 B1
(45) Date of Patent: Jul. 5, 2022

(54) SYSTEMS AND METHODS FOR COMMAND INTERPRETATION IN AN ELECTRONIC DESIGN AUTOMATION ENVIRONMENT

(71) Applicant: Cadence Design Systems, Inc., San Jose, CA (US)

(72) Inventors: Tulio Paschoalin Leao, Betim (BR); Gabriel Guedes de Azevedo Barbosa, Nova Lima (BR); Artur Melo Mota Costa, Belo Horizonte (BR); Alberto Manuel Arias Drake, Belo Horizonte (BR); Guilherme Seminotti Braga, Belo Horizonte (BR); Rodrigo Fonseca Rocha Soares, Belo Horizonte (BR); Rogério de Souza Moraes, Belo Horizonte (BR); Paula Selegato Mathias, Nova Lima (BR); Tales Bontempo Cunha, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 1129 days.

(21) Appl. No.: 15/494,882

(22) Filed: Apr. 24, 2017

(51) Int. Cl.
*G06N 20/00* (2019.01)
*G06F 16/951* (2019.01)

(52) U.S. Cl.
CPC ........... *G06N 20/00* (2019.01); *G06F 16/951* (2019.01)

(58) Field of Classification Search
CPC ........ G06N 20/00; G06N 20/10; G06N 20/20; G06F 16/951
See application file for complete search history.

(56) References Cited

U.S. PATENT DOCUMENTS

| 6,789,246 | B1* | 9/2004 | Mohan | G06F 30/39 716/112 |
| 8,726,209 | B1* | 5/2014 | Lamant | G06F 30/39 716/111 |
| 2004/0148170 | A1* | 7/2004 | Acero | G06F 40/216 704/257 |
| 2006/0107178 | A1* | 5/2006 | Maciver | H03M 13/09 714/758 |
| 2008/0127105 | A1* | 5/2008 | Finley | G06F 9/45512 717/127 |
| 2010/0315688 | A1* | 12/2010 | Nielsen | G06K 9/00 358/474 |
| 2011/0185307 | A1* | 7/2011 | Toyooka | G06F 17/10 715/780 |

(Continued)

OTHER PUBLICATIONS

Golovin et al., "Reinforcement Learning Architecture for Web Recommendations", Proceedings of the International Conference on Information Technology: Coding and Computing (ITCC'04) (Year: 2004).*

*Primary Examiner* — Shane D Woolwine
(74) *Attorney, Agent, or Firm* — Mark H. Whittenberger, Esq.; Holland & Knight LLP

(57) ABSTRACT

The present disclosure relates to a computer-implemented method for use in an electronic design. Embodiments may include receiving, using at least one processor, a user input corresponding to a command in an electronic design automation environment. Embodiments may further include comparing the user input with a portion of an electronic design database. Embodiments may also include providing a final command suggestion based upon, at least in part, the comparison.

14 Claims, 8 Drawing Sheets

(56) References Cited

U.S. PATENT DOCUMENTS

| | | | |
|---|---|---|---|
| 2015/0026635 A1* | 1/2015 | Gohr | G06F 8/36 |
| | | | 715/780 |
| 2015/0082266 A1* | 3/2015 | Mizuta | G06F 30/39 |
| | | | 716/118 |
| 2018/0137137 A1* | 5/2018 | Jin | G06F 16/90324 |

* cited by examiner

SYSTEMS AND METHODS FOR COMMAND INTERPRETATION IN AN ELECTRONIC DESIGN AUTOMATION ENVIRONMENT

FIELD OF THE INVENTION

The present disclosure relates to electronic design techniques, and more specifically, to a system and method for command interpretation an electronic design.

DISCUSSION OF THE RELATED ART

Current users of electronic design automation ("EDA") tools have a hard time switching to and from different EDA products. For them to keep track of the correct command syntax, as well as knowing how to convey his/her desired course of action in command form to the program is often difficult, especially for new users.

Whenever the user wants to do an operation on using EDA software, he or she may type a command in the console and expect it to be executed as intended. This may not happen for a variety of reasons, for example, because of a typographical error, a missing argument or due to the fact that the typed command doesn't even exist. The tool will then warn the user that the command is invalid/unrecognizable and the interaction will end there.

SUMMARY

In one or more embodiments of the present disclosure, a computer-implemented method for use in an electronic design is provided. The method may include receiving, using at least one processor, a user input corresponding to a command in an electronic design automation environment. The method may further include comparing the user input with a portion of an electronic design database. The method may also include providing a final command suggestion based upon, at least in part, the comparison.

One or more of the following features may be included. In some embodiments, the user input may be a correct command input. The final command suggestion may be to execute the user input. The user input may be a mistyped command input. The final command suggestion may be a corrected tool command. The user input may be an abstract description. The final command suggestion may be a corresponding tool command. The electronic design database may include at least one of a manual, an expert guide, online support material, an expert email, and a wiki document. The method may include training a model based upon the received user input and the final command suggestion. Training may include a Naïve Bayes Classifier.

In some embodiments, a computer-readable storage medium having stored thereon instructions that when executed by a machine result in one or more operations is provided. Operations may include receiving, using at least one processor, a user input corresponding to a command in an electronic design automation environment. Operations may further include comparing the user input with a portion of an electronic design database. Operations may also include providing a final command suggestion based upon, at least in part, the comparison.

One or more of the following features may be included. In some embodiments, the user input may be a correct command input. The final command suggestion may be to execute the user input. The user input may be a mistyped command input. The final command suggestion may be a corrected tool command. The user input may be an abstract description. The final command suggestion may be a corresponding tool command. The electronic design database may include at least one of a manual, an expert guide, online support material, an expert email, and a wiki document. Operations may include training a model based upon the received user input and the final command suggestion.

In one or more embodiments of the present disclosure, a system is provided. The system may include a computing device configured to receive, using at least one processor, a user input corresponding to a command in an electronic design automation environment. The at least one processor may be further configured to compare the user input with a portion of an electronic design database and to provide a final command suggestion based upon, at least in part, the comparison.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
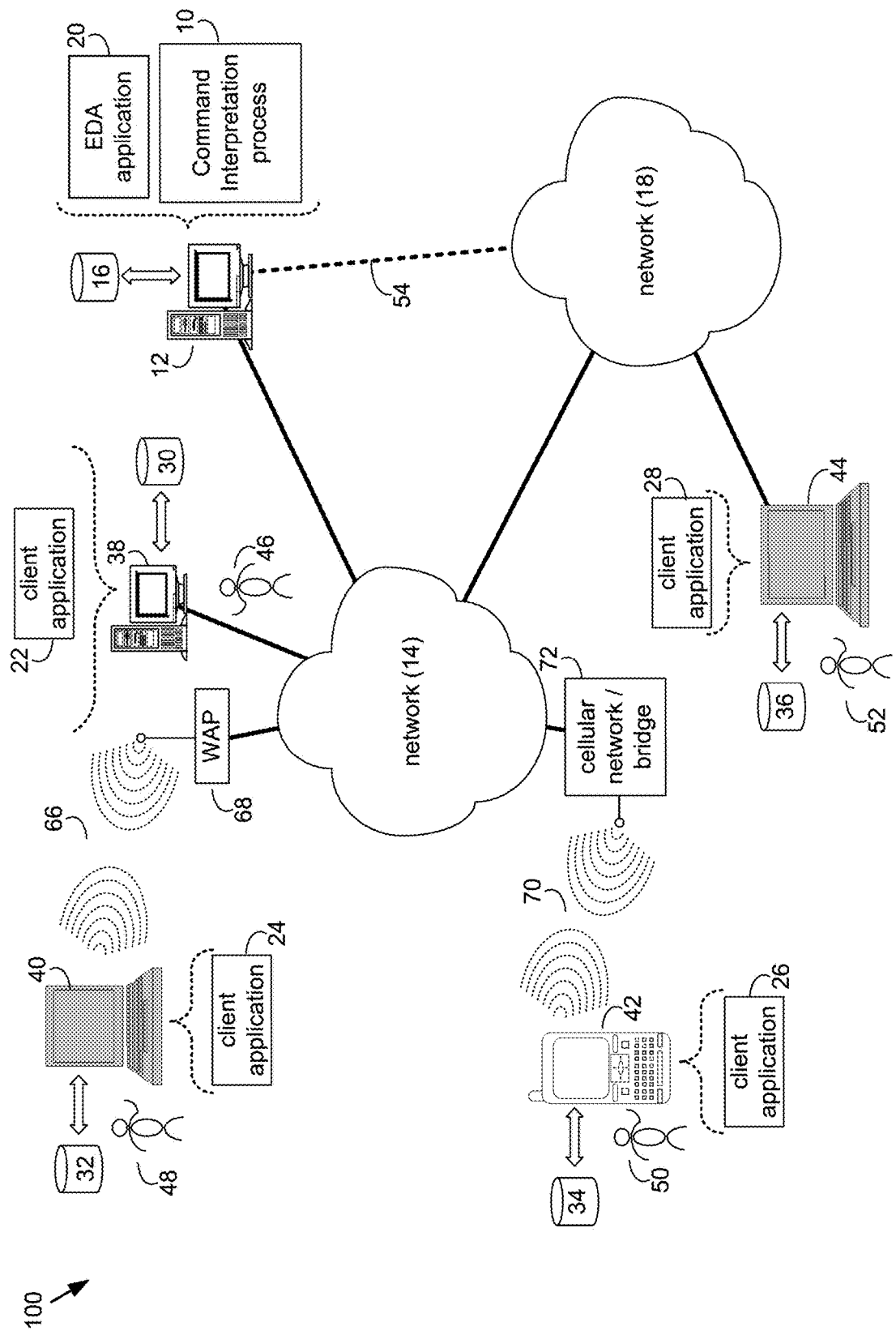
FIG. 1 is a system diagram depicting aspects of the command interpretation process in accordance with an embodiment of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown a command interpretation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the command interpretation process may reside on and be executed, in whole or in part, by a client electronic device, such as a personal computer, notebook computer, personal digital assistant, or the like.

The instruction sets and subroutines of command interpretation process 10, which may include one or more software modules, and which may be stored on storage device 16 coupled to server computer 12, may be executed by one or more processors (not shown) and one or more memory modules (not shown) incorporated into server computer 12.

Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language ("HDL") files and/or any suitable files that may be associated with an electronic design.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Command interpretation process 10 may be a stand alone application, or may be an applet/application/script that may interact with and/or be executed within EDA application 20. In addition/as an alternative to being a server-side process, the command interpretation process may be a client-side process (not shown) that may reside on a client electronic device (described below) and may interact with an EDA client application (e.g., one or more of EDA client applications 22, 24, 26, 28). Further, the command interpretation process may be a hybrid server-side/client-side process that may interact with EDA application 20 and an EDA client application (e.g., one or more of client applications 22, 24, 26, 28). As such, the command interpretation process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize command interpretation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
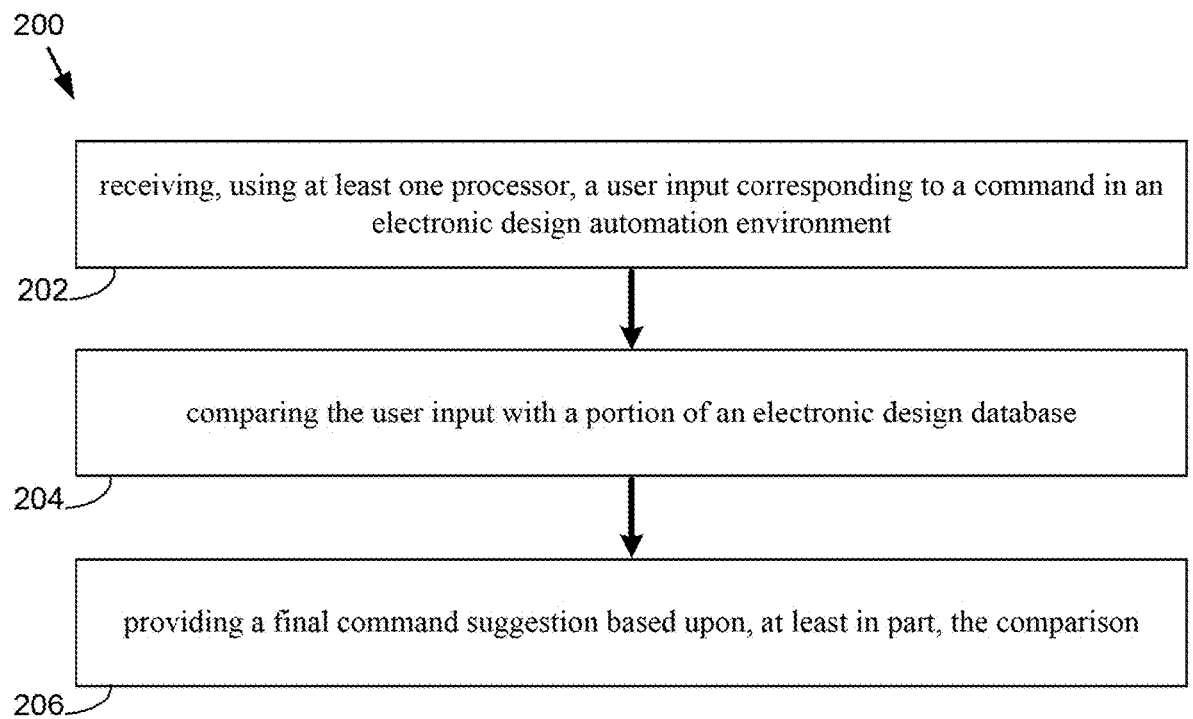
FIG. 2 is a flowchart depicting operations consistent with the command interpretation process of the present disclosure.
Figure 3:
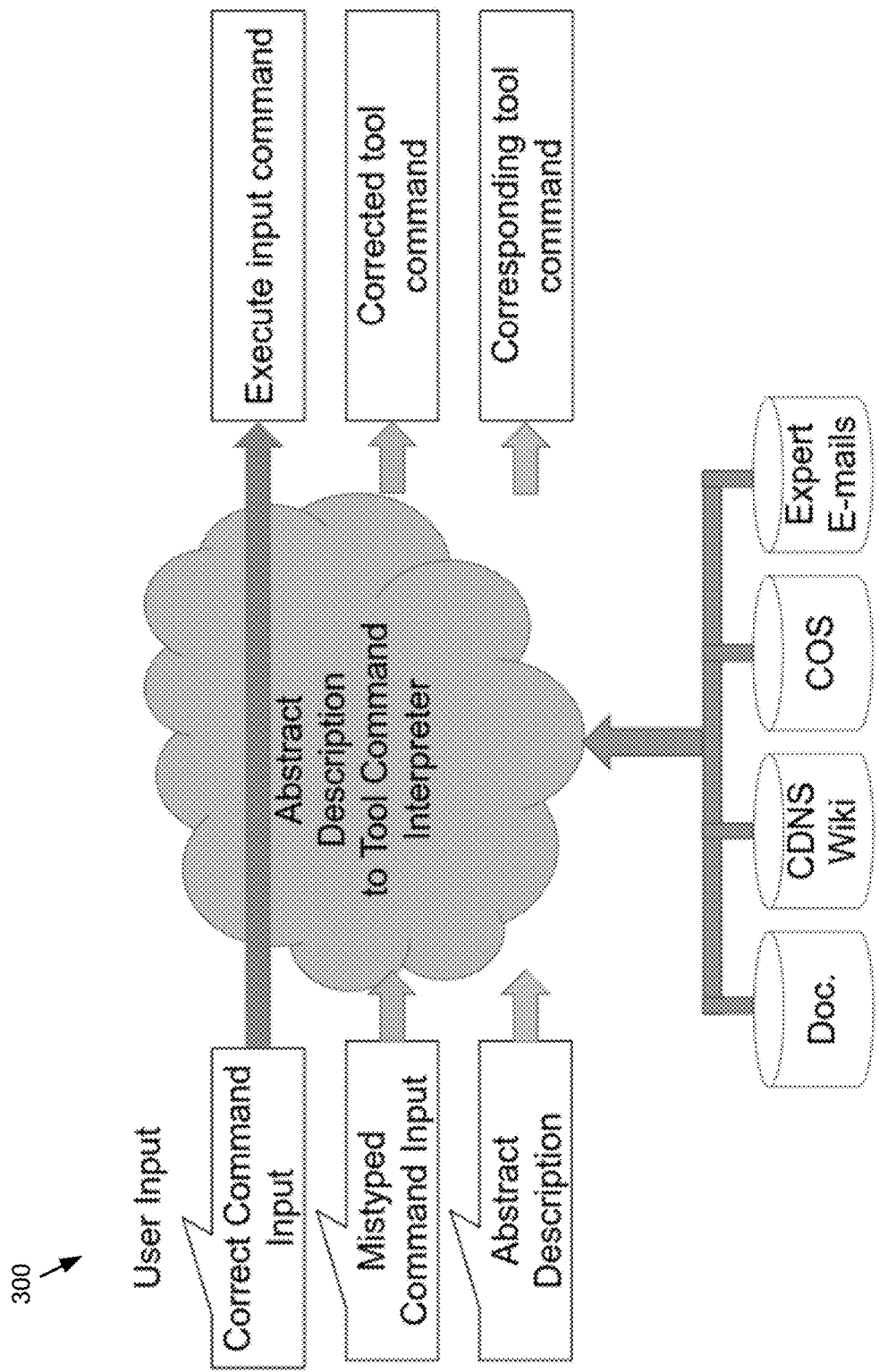
FIG. 3 is a diagram depicting aspects of the command interpretation process in accordance with an embodiment of the present disclosure.

Referring now to FIG. 2, a method 200 consistent with an embodiment of command interpretation process 10 is provided. The method may include receiving (202), using at least one processor, a user input corresponding to a command in an electronic design automation environment. The method may further include comparing (204) the user input with a portion of an electronic design database and providing (206) a final command suggestion based upon, at least in part, the comparison.

Referring now to FIGS. 3-8, additional embodiments consistent with command interpretation process 10 are provided. As discussed above, current users of electronic design automation ("EDA") tools have a hard time switching to and from different EDA products. For them to keep track of the correct command syntax, as well as knowing how to convey his/her desired course of action in command form to the program is often difficult, especially for new users. Whenever the user wants to do an operation on using EDA software, he or she may type a command in the console and expect it to be executed as intended. This may not happen for a variety of reasons, for example, because of a typographical error, a missing argument or due to the fact that the typed command doesn't even exist. The tool will then warn the user that the command is invalid/unrecognizable and the interaction will end there.

In contrast, embodiments of command interpretation process 10 may be based on the interpretation of an abstract description input given by the user. Accordingly, command interpretation process 10 may suggest the correct command he or she needs to use, with the exact syntax, relieving them of the burden of learning and memorizing commands, switches and their syntax.

Embodiments of command interpretation process 10 may be configured to receive an input from a user and, after the user has typed the desired action, command interpretation process 10 may analyze the input and, if it determines that the user meant something else, it would suggest the correct command back.

In some embodiments, and referring again to FIG. 3, command interpretation process 10 may be configured to operate in a number of scenarios. For example, the user may enter everything correctly and the system may not interrupt him/her, unless a highly verbose mode of the suggestion mechanism was toggled on. Additionally and/or alternatively, command interpretation process 10 may perceive an invalid command syntax and suggest the correct one instead, diminishing his/her downtime. In some embodiments, command interpretation process 10 may read any user input, most notably an abstract description of what he/she wants to accomplish, and then convey the command line that was determined.

Embodiments of command interpretation process 10 may be configured to access various types of documentation in order to provide a final command suggestion. For example, the database may be loaded with the tool command language help and EDA wiki documentation, as well as experts' e-mails on how to use such a tool. In this way, embodiments of command interpretation process 10 may determine what keywords are usually correlated with a set of given commands. This may occur during a training phase associated with command interpretation process 10. At the end of the training phase, process 10 may be able to weigh any phrase that is fed into it against the internal representation it has constructed and then output the command which fits the description best. As the system is used, it may analyze whether the user accepted the suggestion or not to improve its accuracy using any learning techniques, thus increasing its usefulness overtime. In some embodiments, a Naïve Bayes Classifier may be used. This may be trained with a set of user inputs that map to the proper commands and then used. It should be noted that the classifier may be changed depending on the application, scale and user flow.

In some embodiments, command interpretation process 10 may use machine learning, and as such, command interpretation process 10 may be configured to scan all available documentation (manuals, expert guides, EDA online support material, etc.) to map EDA keywords into the corresponding command of an EDA platform. Having done so, command interpretation process 10 may scan a user input, which might deviate from a correct command syntax or even fail to match any listed command at all, and then suggest back the correct command.

Figure 4:
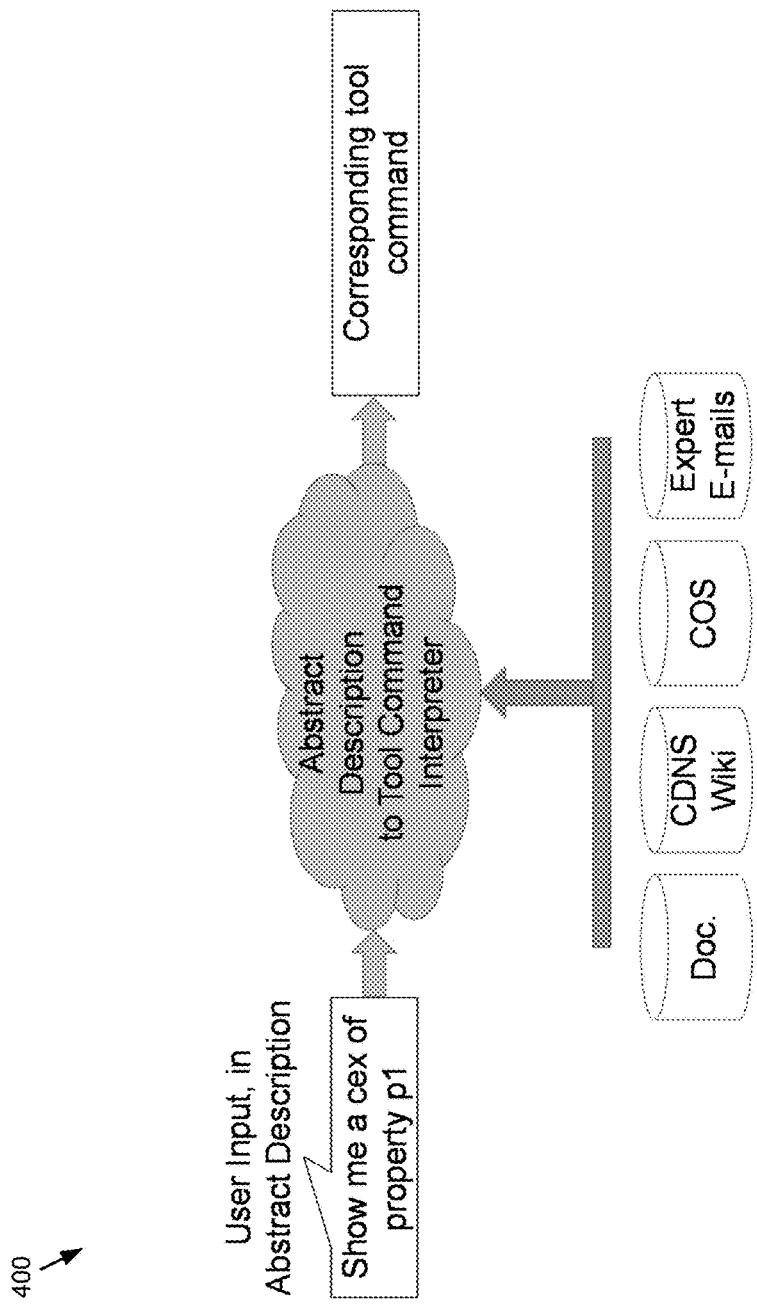
FIG. 4 is a diagram depicting aspects of the command interpretation process in accordance with an embodiment of the present disclosure.
Figure 5:
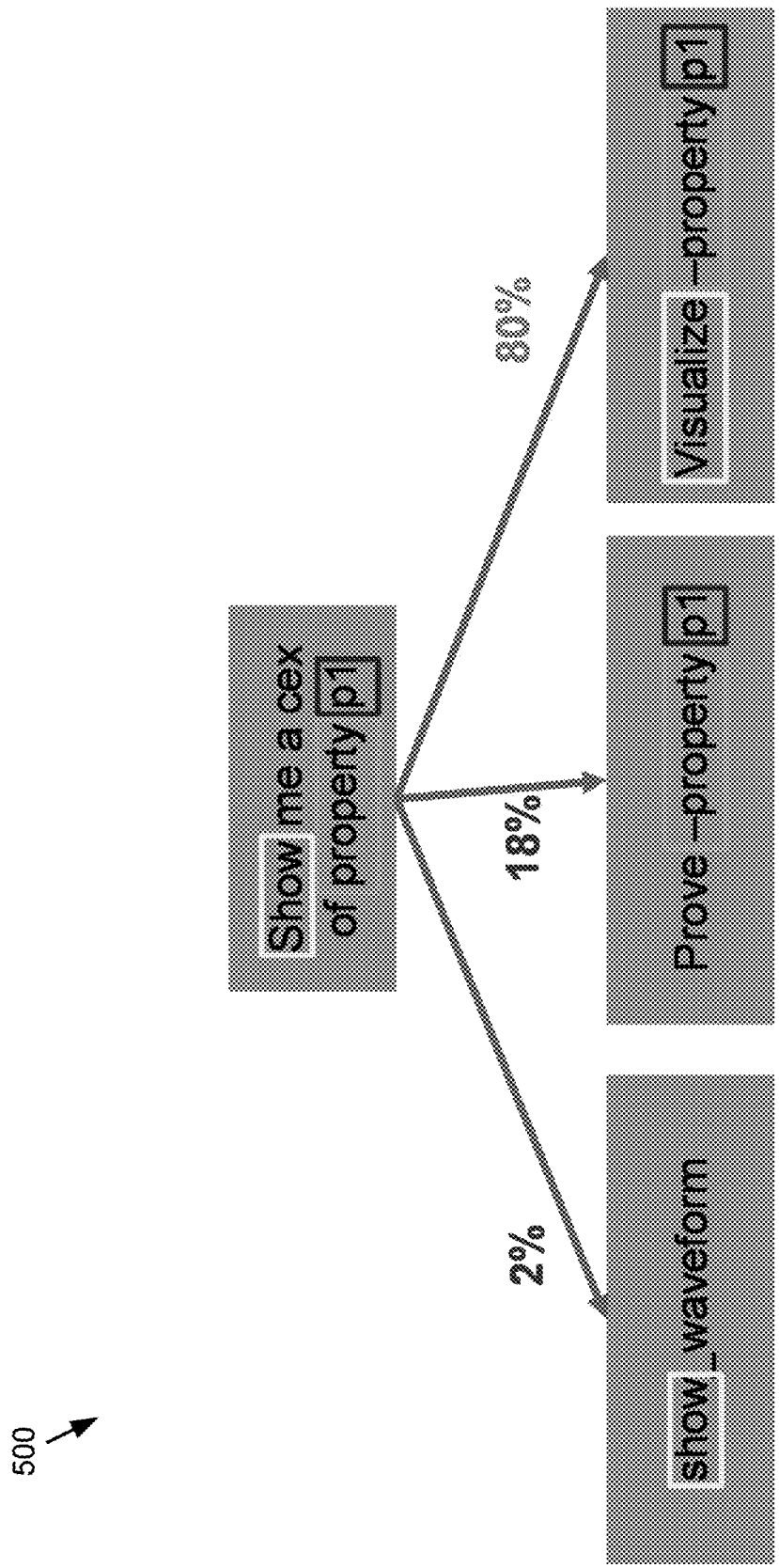
FIG. 5 is a diagram depicting aspects of the command interpretation process in accordance with an embodiment of the present disclosure.

For example, and referring to FIGS. 4-5, another embodiment consistent with command interpretation process 10 is provided. In this particular embodiment, the user input is "show me a cex of property p1". This is an example of an abstract description that may be interpreted by command interpretation process 10. FIG. 5 depicts the various probabilities associated with each of the possible commands as determined by command interpretation process 10. Namely, show_waveform at 2%, prove-property p1 at 18%, and visualize property p1 at 80%.

Figure 6:
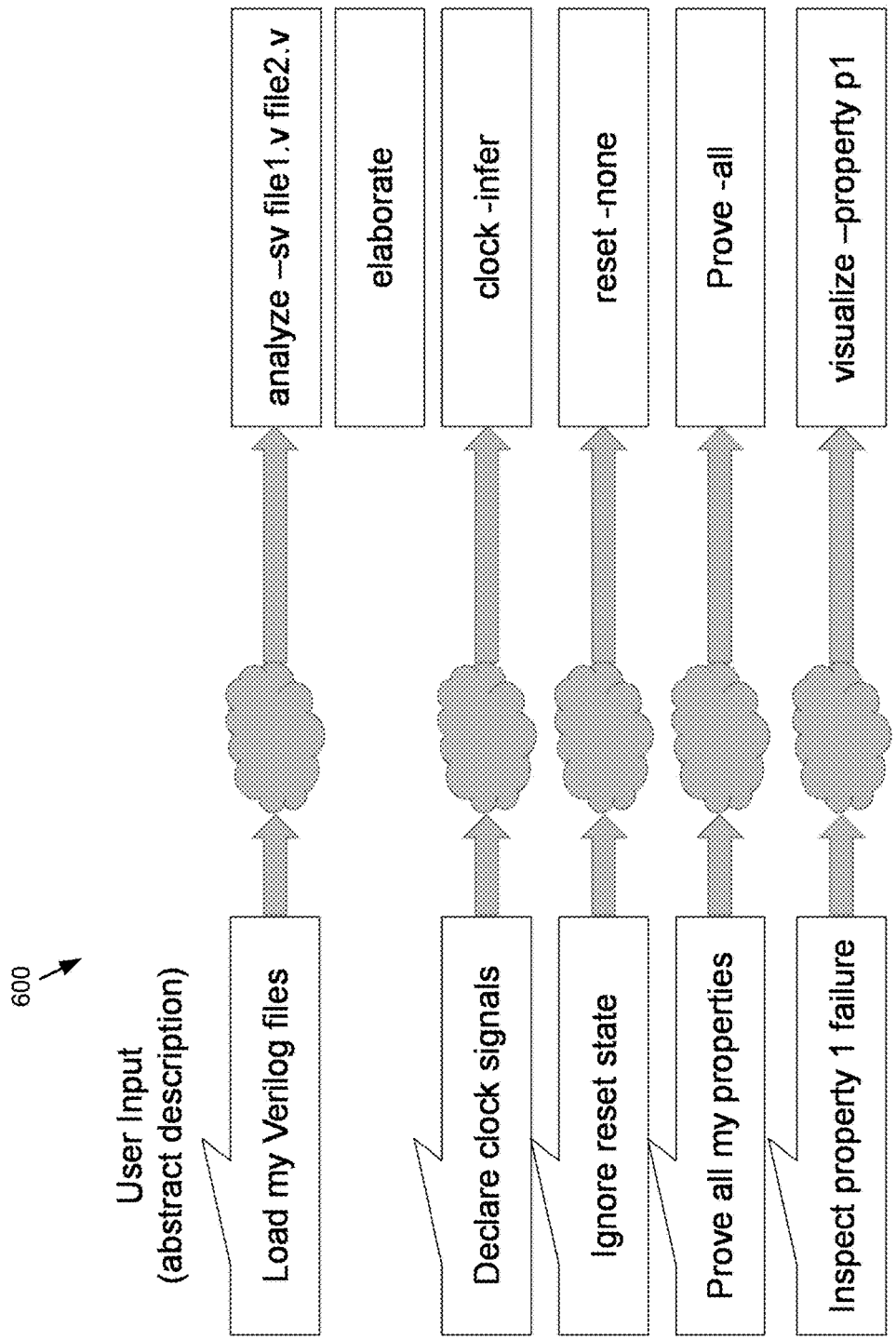
FIG. 6 is a diagram depicting aspects of the command interpretation process in accordance with an embodiment of the present disclosure.
Figure 7:
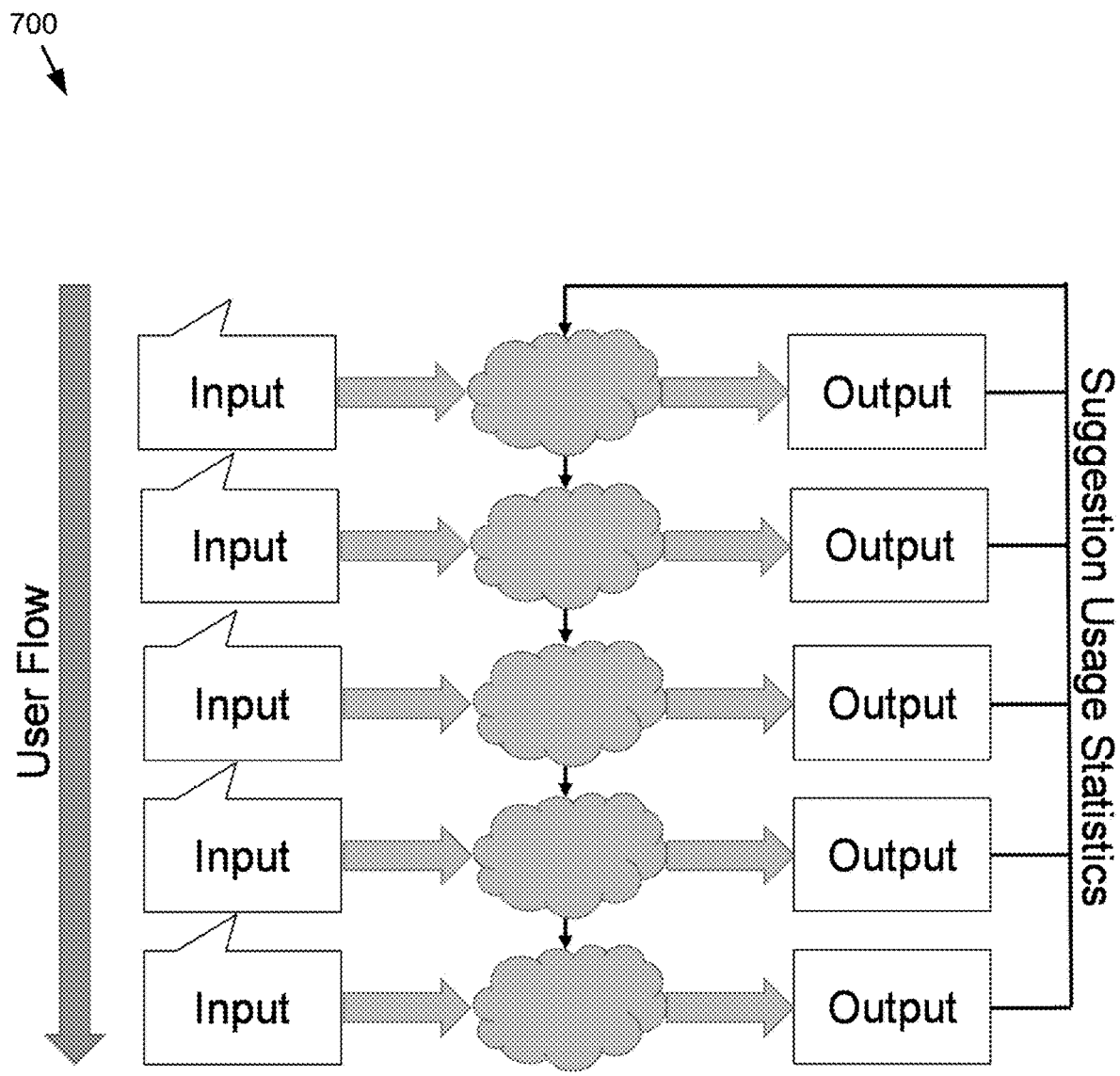
FIG. 7 is a diagram depicting aspects of the command interpretation process in accordance with an embodiment of the present disclosure.

Referring also to FIG. 6, examples of other possible abstract description user inputs are provided. In this example, the user input "load my Verilog files" may be received and command interpretation process 10 may determine that the final command suggestion should be "analyze-sv file1.v file2.v". Similarly, the user input "declare clock signals" may be determined to be the clock-infer command, "ignore reset state" may be determined to be reset-none, and so on. FIG. 7 depicts an embodiment showing how command interpretation process 10 may be trained and how it may improve with further use over time by various designers.

Figure 8:
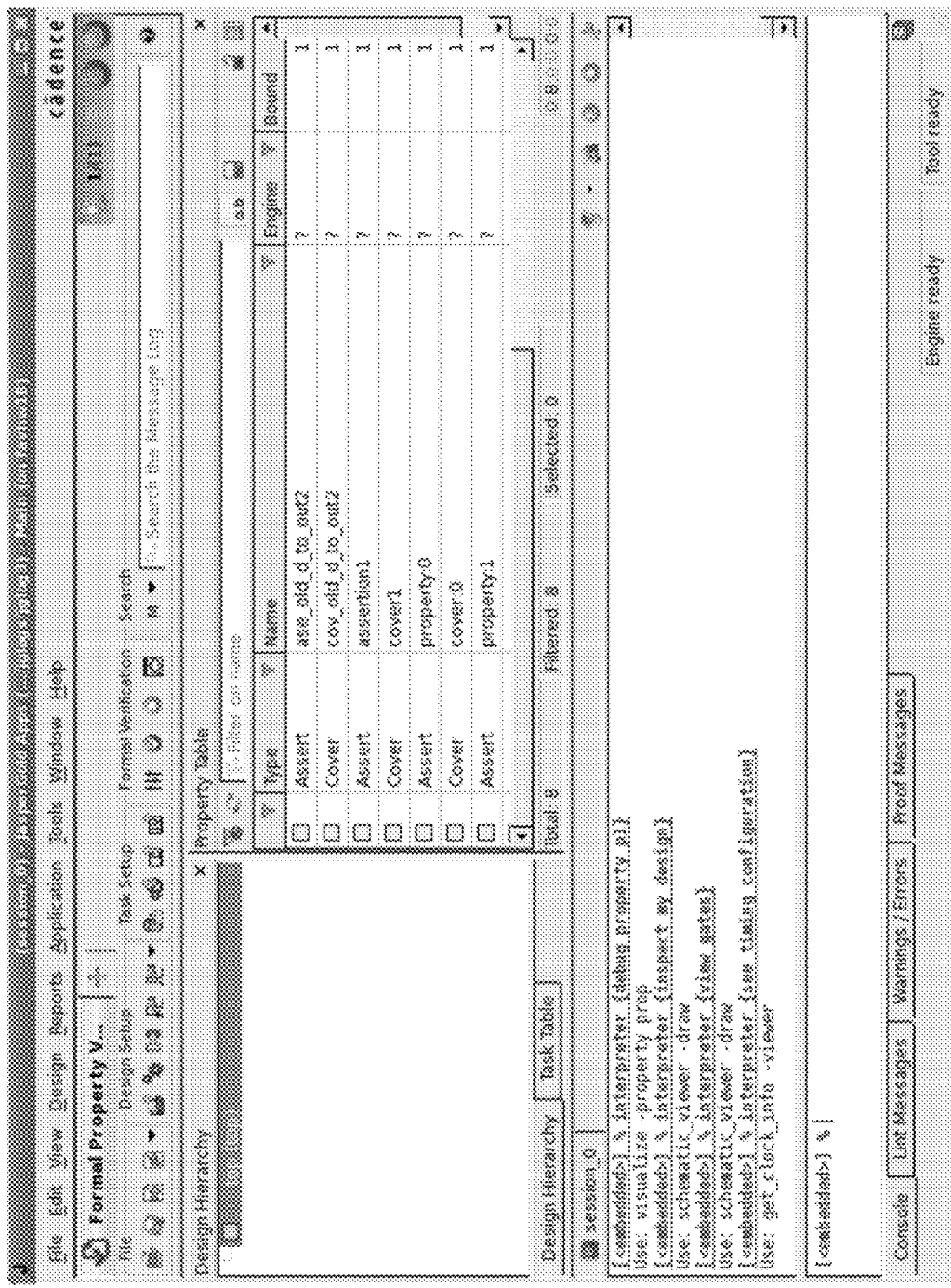
FIG. 8 is a graphical user interface depicting aspects of the command interpretation process in accordance with an embodiment of the present disclosure.

Referring also to FIG. 8, a graphical user interface 800 is provided. As is shown in the Figure, an embodiment of this idea would have the user feeding the tool with text through a specific action, which is represented in the figure by the interpreter command, which is one, but not the only implementation option. The tool would then analyze the input and suggest the most appropriate corresponding command back to the user. Another embodiment would have the user input fed directly, without an interpreter command and delimiting characters, with the tool acting in a similar manner.

In some embodiments, command interpretation process 10 may allow the user to type freely into the command line of the program and expect the tool to infer the correct usage of what he or she is trying to do. This is in contrast to conventional implementations that would just error out and ask the user to try again or to refer to the product's manual and/or documentation.

Embodiments of command interpretation process 10 may enable a new user to avoid reviewing documentation to get started on the tool. As such, the user may try using commands from other products and allow the tool to infer what he or she is trying to convey. This greatly diminishes the current steep learning curve for introducing a new EDA tool to an user. Additionally and/or alternatively, experienced users might combine keywords to explore the design or a new configuration the user wants, without having to piece together the information they possess. Moreover, the tool would improve itself upon usage, leading to more accurate predictions over time and more complex suggestions. Ultimately, a user input could be converted into a series of commands, instead of a single one, making it highly script-friendly. In some embodiments, analysis of the user input could provide hints on what the expected syntax is or what are the features requested by the users that cannot currently be provided, hinting at what should be developed next for the tool.

In some embodiments, EDA application 20 and/or command interpretation process 10 may support a variety of languages and/or standards. EDA application 20 may support one or more software extensions and may be used in conjunction with one or more EDA tools such as those available from the Assignee of the subject application.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for use in an electronic design comprising:
   receiving at a graphical user interface, using at least one processor, a user input corresponding to a command in an electronic design automation environment;
   analyzing the user input to determine whether the user input is an abstract description, wherein the abstract description is selected from the group consisting of: loading one or more files, declaring one or more clock signals, ignoring a state, proving one or more properties, and inspecting a property failure;
   comparing the user input with a portion of an electronic design database, wherein comparing includes electronically scanning a plurality of different documentation types included within the electronic design database and mapping one or more keywords associated with the user input;
   providing a final command suggestion at the graphical user interface based upon, at least in part, the comparison; and
   training a machine learning model based upon the received user input and the final command suggestion.

2. The computer-implemented method of claim 1, wherein the final command suggestion is to execute the user input.

3. The computer-implemented method of claim 1, wherein the final command suggestion is a corrected tool command.

4. The computer-implemented method of claim 1, wherein the final command suggestion is a corresponding tool command.

5. The computer-implemented method of claim 1, wherein the electronic design database includes at least one of a manual, an expert guide, online support material, an expert email, and a wiki document.

6. The computer-implemented method of claim 1, wherein training includes a Naïve Bayes Classifier.

7. The computer-implemented method of claim 1, wherein the abstract description lacks a correct command syntax.

8. A non-transitory computer-readable storage medium having stored thereon instructions that when executed by a machine result in the following operations:
   receiving at a graphical user interface, using at least one processor, a user input corresponding to a command in an electronic design automation environment;
   analyzing the user input to determine whether the user input is a correct command input, a mistyped command input, or an abstract description, wherein the abstract description is selected from the group consisting of: loading one or more files, declaring one or more clock signals, ignoring a state, proving one or more properties, and inspecting a property failure;
   comparing the user input with a portion of an electronic design database, wherein comparing includes electronically scanning a plurality of different documentation types included within the electronic design database and mapping one or more keywords associated with the user input, wherein the electronic design database includes a manual, an expert guide, online support material, an expert email, and a wiki document;
   providing a final command suggestion at the graphical user interface based upon, at least in part, the comparison;
   analyzing whether a user accepted or rejected the final command suggestion; and
   training a machine learning model based upon the received user input, the final command suggestion, and whether the user accepted or rejected the final command suggestion.

9. The non-transitory computer-readable storage medium of claim 8, wherein the user input is a correct command input.

10. The non-transitory computer-readable storage medium of claim 9, wherein the final command suggestion is to execute the user input.

11. The non-transitory computer-readable storage medium of claim 8, wherein the user input is a mistyped command input.

12. The non-transitory computer-readable storage medium of claim 11, wherein the final command suggestion is a corrected tool command.

13. The non-transitory computer-readable storage medium of claim 8, wherein the final command suggestion is a corresponding tool command.

14. A system comprising:
   a computing device configured to receive at a graphical user interface, using at least one processor, a user input corresponding to a command in an electronic design automation environment, the at least one processor further configured to analyze the user input to determine whether the user input is an abstract description, wherein the abstract description is selected from the group consisting of: loading one or more files, declaring one or more clock signals, ignoring a state, proving one or more properties, and inspecting a property failure, the at least one processor further configured to compare the user input with a portion of an electronic design database, wherein comparing includes electronically scanning a plurality of different documentation types included within the electronic design database and mapping one or more keywords associated with the user input and to provide a final command suggestion at the graphical user interface based upon, at least in part, the comparison, the at least one processor further configured to train a machine learning model based upon the received user input and the final command suggestion.

* * * * *